United States Patent
Okugi et al.

(10) Patent No.: US 11,522,541 B2
(45) Date of Patent: Dec. 6, 2022

(54) SEMICONDUCTOR DEVICE (71) Applicants: Kabushiki Kaisha Toshiba, Tokyo (JP); Toshiba Electronic Devices & Storage Corporation, Tokyo (JP)

(72) Inventors: Joi Okugi, Kokubunji (JP); Daisuke Katori, Kawasaki Kanagawa (JP); Satoru Suzuki, Kawasaki Kanagawa (JP); Satoshi Kamiya, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/463,331

(22) Filed: Aug. 31, 2021

(65) Prior Publication Data
US 2022/0085807 A1 Mar. 17, 2022

(30) Foreign Application Priority Data
Sep. 11, 2020 (JP) .............................. JP2020-152703

(51) Int. Cl.
*H03K 17/687* (2006.01)
*G01R 31/26* (2020.01)

(52) U.S. Cl.
CPC ..... *H03K 17/6872* (2013.01); *G01R 31/2621* (2013.01)

(58) Field of Classification Search
CPC .................................................. H03K 17/6872
See application file for complete search history.

(56) References Cited

U.S. PATENT DOCUMENTS 6,686,899 B2 * 2/2004 Miyazawa ............. H03K 5/003
              327/333
9,071,250 B2    6/2015 Okano

FOREIGN PATENT DOCUMENTS

| JP | 61-061437 A   | 3/1986 |
|----|---------------|--------|
| JP | 2012-159370 A | 8/2012 |
| JP | 5287048 B2    | 9/2013 |
| JP | 5776768 B2    | 9/2015 |

* cited by examiner

*Primary Examiner* — Metasebia T Retebo
(74) *Attorney, Agent, or Firm* — Allen & Overy LLP (57) ABSTRACT

A semiconductor device of an embodiment includes: a power supply line and a ground line; a CMOS logic gate including a P-type MOSFET network connected to the power supply line, and an N-type MOSFET network connected to a ground line side of the P-type MOSFET network; and a P-type MOSFET and an N-type MOSFET configured to activate a parasitic capacitance of the CMOS logic gate by fixing an output signal level of the CMOS logic gate.

12 Claims, 6 Drawing Sheets

SEMICONDUCTOR DEVICE

CROSS-REFERENCE TO RELATED APPLICATIONS

This application is based upon and claims the benefit of priority from the prior Japanese Patent Application No. 2020-152703 filed in Japan on Sep. 11, 2020; the entire contents of which are incorporated herein by reference.

FIELD

Embodiments described herein relate generally to semiconductor devices.

BACKGROUND

Fluctuations occur to the power supply voltages of semiconductor devices. Therefore, fluctuations of the power supply voltages have conventionally been restricted by connecting decoupling capacitors between power supplies and grounds.

However, when a decoupling capacitor is provided on a chip of a semiconductor device, a chip area increases, and manufacturing cost increases.

DETAILED DESCRIPTION

Semiconductor devices of embodiments each include: a power supply line and a ground line; a CMOS logic gate including a P-type MOSFET network connected to the power supply line, and an N-type MOSFET network connected to a ground line side of the P-type MOSFET network; and a MOSFET configured to give a potential difference to a parasitic capacitance of the CMOS logic gate by fixing an output signal level of the CMOS logic gate.

Hereinafter, embodiments will be described with reference to the drawings.

First Embodiment (Basic Configuration)

Figure 1:
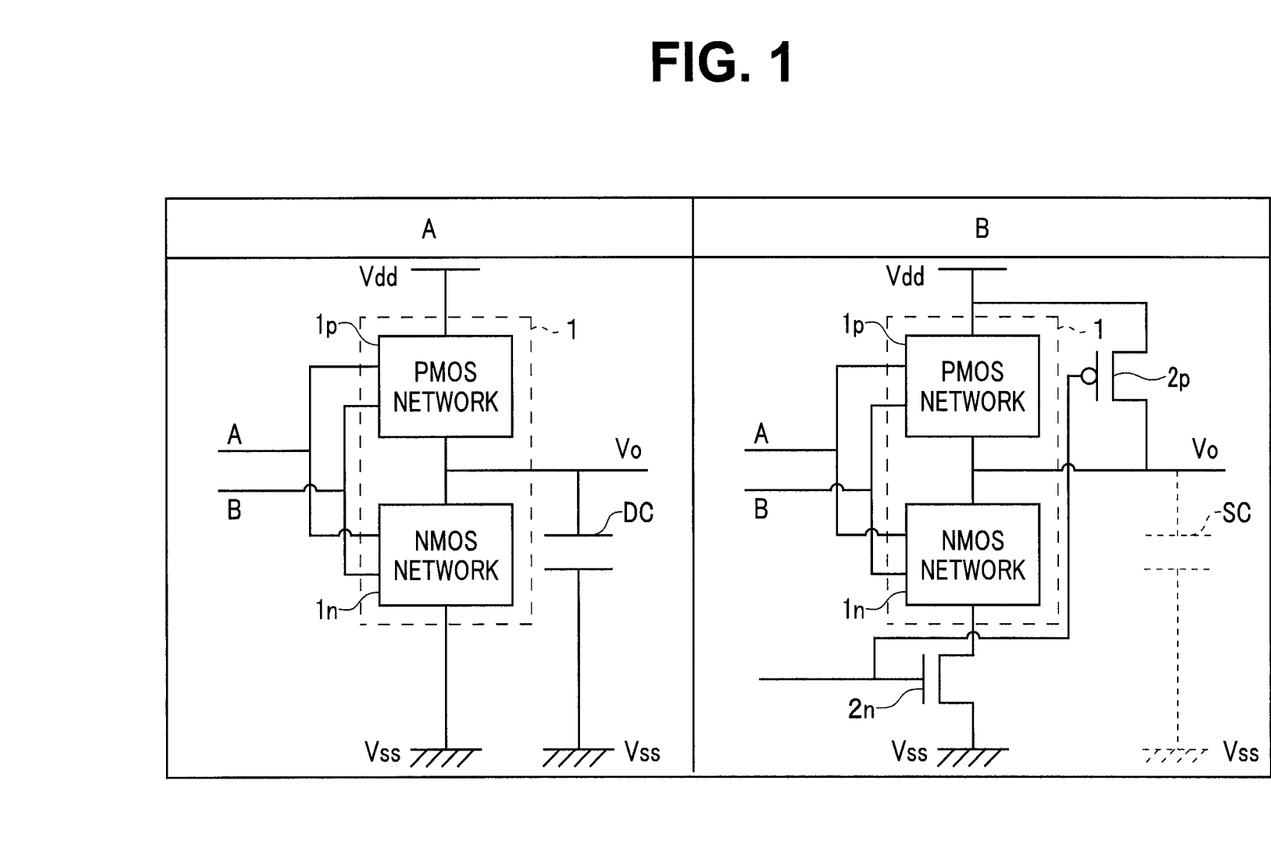
FIG. 1 is a diagram for explaining an outline of a configuration of a semiconductor device according to a first embodiment in comparison with a comparative example.

FIG. 1 is a diagram for explaining an outline of a configuration of a semiconductor device according to the present embodiment in comparison with a comparative example.

Column A in FIG. 1 illustrates a configuration of a semiconductor device of the comparative example.

The semiconductor device includes a power supply line Vdd and a ground line Vss, and a CMOS logic gate 1. The CMOS (Complementary MOS) logic gate 1 has a PMOS network 1*p* that is a PMOS (P-type metal-oxide-semiconductor field-effect transistor) cell library, and an NMOS network 1*n* that is an NMOS (N-type metal-oxide-semiconductor field-effect transistor) cell library. The CMOS logic gate 1 is a logic gate having a plurality of CMOSs configured by NMOSs and PMOSs. The PMOS network 1*p* is connected to the power supply line Vdd, and the NMOS network 1*n* is connected between the PMOS network 1*p* and the ground line Vss.

Each of CMOSs of the CMOS logic gate 1 has one or more inputs of any number. FIG. 1A illustrates an example where the CMOS logic gate 1 has two inputs that are an input signal A and an input signal B. The CMOS logic gate 1 outputs a signal corresponding to a combination of values of a plurality of input signals from an output line Vo extended from between the PMOS network 1*p* and the NMOS network 1*n*.

In the comparative example, a decoupling capacitor DC is provided between the output line Vo and the ground line Vss of the CMOS logic gate 1. The decoupling capacitor DC passes a fluctuation (alternating-current component) that occurs to a voltage (power supply voltage) between the power supply line VDD and the ground line Vss of the semiconductor device to the ground line Vss, and thereby restricts the fluctuation to stabilize the power supply voltage.

At this time, in order to reduce capacitive reactance and improve characteristics in a wide frequency band, an electrostatic capacitance of the decoupling capacitor DC is desirably large. Consequently, when the decoupling capacitor DC is formed on the chip of the semiconductor device, the chip area increases and cost increases.

Column B in FIG. 1 illustrates one configuration example of the semiconductor device according to the present embodiment.

In the semiconductor device in column B in FIG. 1, the decoupling capacitor DC is omitted, and two MOS are added, as compared with the semiconductor device in Column A. Note that SC in Column B virtually shows a combined capacitance of activated parasitic capacitances of the CMOS logic gate 1 in the configuration of Column B, but does not show a capacitor provided on the circuit. Here, activation indicates that a potential difference occurs between two conductors and functions as a capacitor. The parasitic capacitances of the CMOS logic gate 1 are activated by performing a decap operation that is described later.

The MOS that is added to perform a decap operation has, for example, a PMOS 2*p* connected between a power supply line Vdd and an output line Vo of the CMOS logic gate 1, and an NMOS 2*n* connected between the CMOS logic gate 1 and a ground line Vss. A configuration where a pair of a PMOS and an NMOS is added to one CMOS logic gate is basic, but an NMOS may be shared when output signal levels of CMOS logic gates are fixed to high (H), or a PMOS may be shared when output signal levels of CMOS logic gates are fixed to low (L), as described later with reference to FIG. 2 and FIG. 3.

For example, a common control signal is inputted to the PMOS 2p and NMOS 2n. When high (H) is inputted to a gate terminal of the PMOS 2p and a gate terminal of the NMOS 2n as a control signal, a source and a drain of the PMOS 2p are electrically disconnected, and a drain and a source of the NMOS 2n are electrically connected. Thereby, the NMOS network 1n is connected to the ground line Vss, and the CMOS logic gate 1 performs a normal operation of outputting a value corresponding to an input signal A/B (normal operation mode).

When low (L) is inputted to the gate terminal of the PMOS 2p and the gate terminal of the NMOS 2n as a control signal, the source and the drain of the PMOS 2p are electrically connected, and the drain and the source of the NMOS 2n are electrically disconnected. Thereby, the output line Vo of the CMOS logic gate 1 is connected to the power supply line Vdd to be fixed to high (H), the CMOS logic gate 1 operates in a decap operation mode as described below, and the combined capacitance SC is activated. The activated combined capacitance SC performs a similar function to a function of the decoupling capacitor DC in Column A, and restricts a voltage fluctuation in the power supply line Vdd to stabilize the power supply voltage.

(Configuration Example Where Output Signal Level is Fixed to High).

Figure 2:
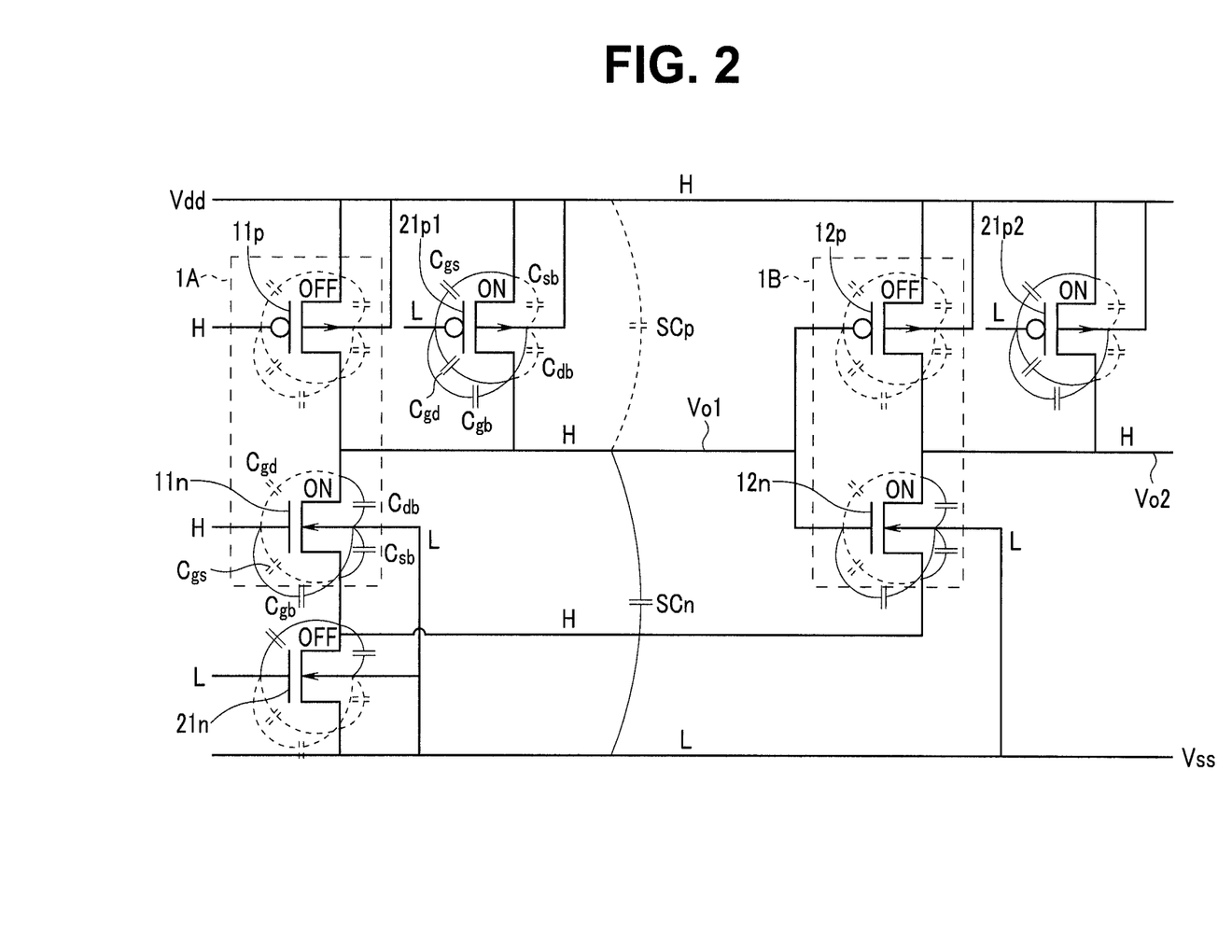
FIG. 2 is a circuit diagram illustrating a configuration example where an output signal level of a CMOS logic gate is fixed to high in the semiconductor device according to the first embodiment.

The decap operation in the configuration of column B in FIG. 1 will be further described with reference to FIG. 2 illustrating a specific example. FIG. 2 is a circuit diagram illustrating a configuration example where an output signal level of a CMOS logic gate is fixed to high (H) in a semiconductor device.

The semiconductor device illustrated in FIG. 2 includes a CMOS logic gate 1A, and a CMOS logic gate 1B connected to an output line Vo1 of the CMOS logic gate 1A.

The CMOS logic gate 1A is configured as a NOT circuit having a PMOS 11p connected to the power supply line Vdd, and an NMOS 11n connected to a ground line Vss side of the PMOS 11p.

The CMOS logic gate 1B is configured as a NOT circuit having a PMOS 12p connected to the power supply line Vdd, and an NMOS 12n connected to the ground line Vss side of the PMOS 12p. The CMOS logic gate 1B outputs a signal from an output line Vo2.

FIG. 2 illustrates a NOT circuit where a PMOS network 1p is configured by one PMOS, and an NMOS network 1n is configured by one NMOS, as one example of a simplified CMOS logic gate.

Further, the semiconductor device includes a PMOS 21p1, a PMOS 21p2, and an NMOS 21n, as MOSs (mode-switching MOSs) for switching operation modes of the CMOS logic gate 1A and the CMOS logic gate 1B to a normal operation mode and a decap operation mode. These mode-switching MOSs are formed as compact MOSs to restrict increase in a chip area of the semiconductor device.

The PMOS 21p1 is connected between the power supply line Vdd and the output line Vo1 of the CMOS logic gate 1A.

The PMOS 21p2 is connected between the power supply line Vdd and the output line Vo2 of the CMOS logic gate 1B.

The NMOS 21n is connected between a source of the NMOS 11n of the CMOS logic gate 1A and a source of the NMOS 12n of the CMOS logic gate 1B, and the ground line Vss. When an output signal level as illustrated in FIG. 2 is fixed to high, a number of mode-switching MOSs is reduced, and increase in the chip area is more effectively restricted by sharing the NMOS 21n between the CMOS logic gate 1A and the CMOS logic gate 1B.

Here, a PMOS and an NMOS each include parasitic capacitances between respective terminals, and a parasitic capacitance between a gate and a source is described as Cgs, a parasitic capacitance between the gate and a drain is described as Cgd, a parasitic capacitance between the source and a back gate is described as Csb, a parasitic capacitance between the drain and the back gate is described as Cdb, and a parasitic capacitance between the gate and the back gate is described as Cgb. These signs are clearly shown in the PMOS 21p1 and the NMOS 11n in FIG. 2, but same signs are used for the other MOSs that are not clearly shown.

When a control signal of high (H) is inputted to respective gates of the mode-switching MOS, that is, the PMOS 21p1, the PMOS 21p2, and the NMOS 21n, the PMOS 21p1 and PMOS 21p2 are turned off, and the NMOS 21n is turned on. Accordingly, the CMOS logic gate 1A and the CMOS logic gate 1B perform a normal operation that is similar to the operation at the time when the mode-switching MOSs are not provided (normal operation mode).

When a control signal of low (L) is inputted to the respective gates of the PMOS 21p1, PMOS 21p2 and NMOS 21n, the PMOS 21p1 and PMOS 21p2 are turned one, and the NMOS 21n is turned off. Thereby, the output line Vo1 of the CMOS logic gate 1A is electrically connected to the power supply line Vdd by the PMOS 21p1 and is fixed to high (H). The output line Vo2 of the CMOS logic gate 1B is electrically connected to the power supply line VDD by the PMOS 21p2, and is fixed to high (H). Accordingly, a signal of high (H) is inputted to the CMOS logic gate that is not illustrated and located at a subsequent stage of the CMOS logic gate 1B.

Since the output line Vo1 is connected to the gate of the PMOS 12p and the gate of the NMOS 12n of the CMOS logic gate 1B, gate inputs of the PMOS 12p and NMOS 12n become high (H). Likewise, an output line of a CMOS logic gate that is not illustrated and located at a preceding stage of the CMOS logic gate 1A is also fixed to high (H), and gates inputs of the PMOS 11p and the NMOS 11n of the CMOS logic gate 1A also become high (H).

In this case, all of the gate terminals, the source terminals, the drain terminals, and the back gate terminals of the PMOS 11p and PMOS 12p become high (H), and therefore none of the parasitic capacitances Cgs, Cgd, Csb, Cdb and Cgb of the PMOS 11p and the PMOS 12p is activated.

In the NMOS 11n and the NMOS 12n, gate terminals, source terminals, and drain terminals become high (H), and back gate terminals become low (L) since the back gate terminals are connected to the ground line Vss. Thereby, the parasitic capacitance Cgb between the gate terminal and the back gate terminal, the parasitic capacitance Csb between the source terminals and the back gate terminals, and the parasitic capacitance Cdb between the drain terminal and the back gate terminal are activated, and the other parasitic capacitances Cgs and Cgd than the parasitic capacitances Cgb, Csb and Cdb are not activated.

In the PMOS 21p1 and the PMOS 21p2, a control signal of low (L) is inputted to gate terminals, and source terminals, drain terminals, and back gate terminals are high (H). Thereby, the parasitic capacitances Cgs between the gate terminals and the source terminals, the parasitic capacitances Cgd between the gate terminals and the drain terminals, and the parasitic capacitances Cgb between the gate terminals and the back gate terminals are activated, and the other parasitic capacitances Csb and Cdb than the parasitic capacitances Cgs, Cgd, and Cgb are not activated.

In the NMOS 21n, a drain terminal is high (H), and a gate terminal, a source terminal, and a back gate terminal are low (L). Thereby, the parasitic capacitance Cgd between the gate terminal and the drain terminal, and the parasitic capacitance Cdb between the drain terminal and the back gate terminal are activated, and the other parasitic capacitances Cgs, Csb and Cgb than the parasitic capacitances Cgd and Cdb are not activated.

However, the mode-switching MOS is formed as a small MOS as described above, and contribution of the activated parasitic capacitance to the combined capacitance is small. Since the parasitic capacitances of the PMOS 11p and the PMOS 12p are not activated, a combined capacitance SCp of the parasitic capacitances does not contribute to a capacitance between the power supply line Vdd and the ground line Vss. Consequently, in the case of high fixing illustrated in FIG. 2, a combined capacitance SCn of the activated parasitic capacitances in the NMOS 11n and the NMOS 12n becomes dominant as the capacitance between the power supply line Vdd and the ground line Vss. The combined capacitance SCn that thus becomes dominant restricts a voltage fluctuation of the power supply line Vdd to stabilize the power supply voltage.

(Configuration Example Where Output Signal Level is Fixed to Low)

Figure 3:
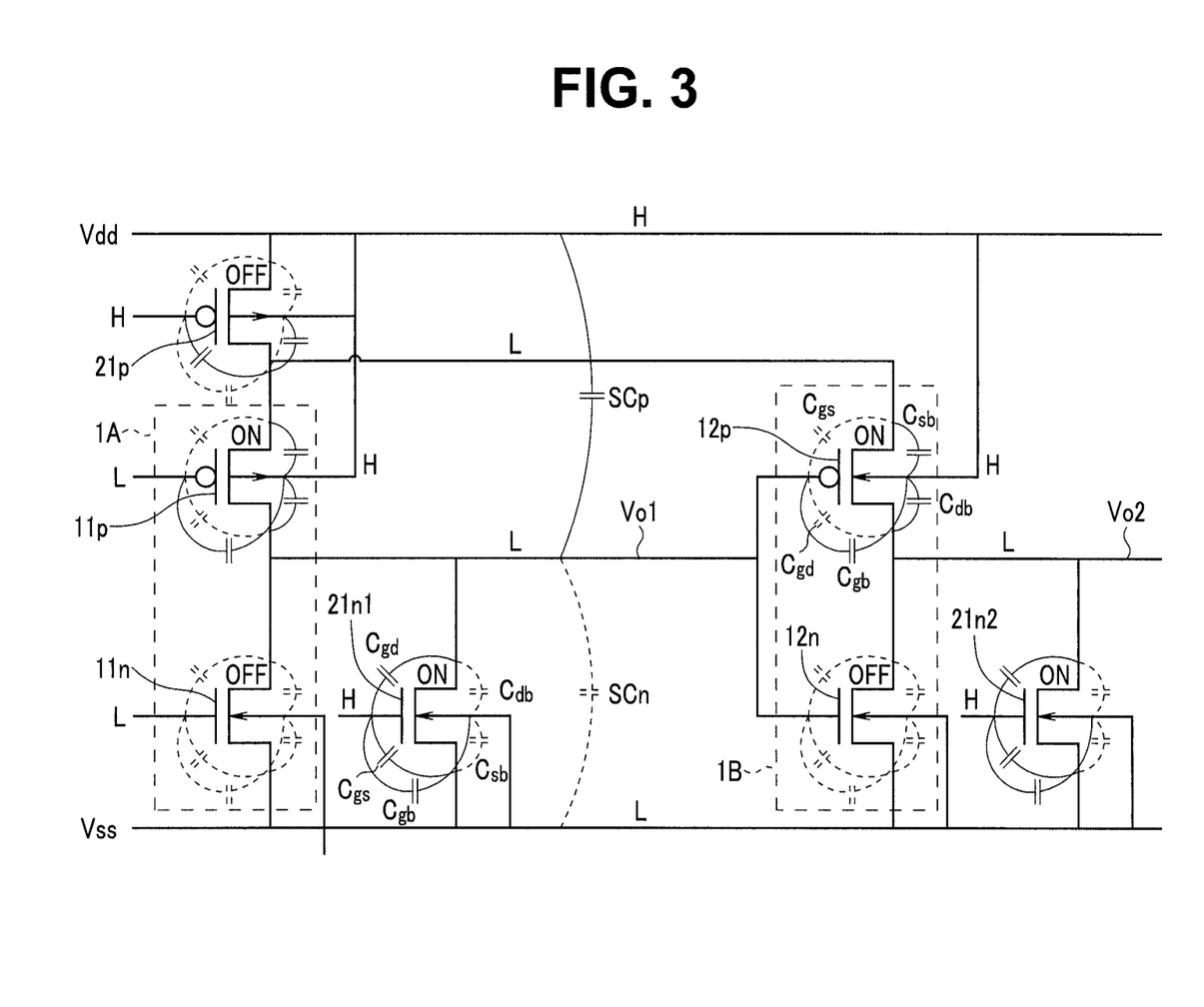
FIG. 3 is a circuit diagram illustrating a configuration example where an output signal level of a CMOS logic gate is fixed to low in the semiconductor device according to the first embodiment.

Although FIG. 2 illustrates the example where the output signal level of the CMOS logic gate is fixed to high (H), the output signal level is not limited to high (H), but the output signal level of the CMOS logic gate may be fixed to low (L). FIG. 3 is a circuit diagram illustrating a configuration example where an output signal level of a CMOS logic gate is fixed to low (L) in a semiconductor device.

The semiconductor device illustrated in FIG. 3 includes a CMOS logic gate 1A, and a CMOS logic gate 1B connected to an output line Vo1 of the CMOS logic gate 1A similarly to the semiconductor device illustrated in FIG. 2.

The semiconductor device illustrated in FIG. 3 includes a PMOS 21p, an NMOS 21n1, and an NMOS 21n2 as mode-switching MOSs. It is the same as the example of FIG. 2 that the mode-switching MOSs are formed as small MOSs (preferably in a minimum-size).

The PMOS 21p is connected between a power supply line Vdd, and a source of a PMOS 11p of the CMOS logic gate 1A and a source of a PMOS 12p of the CMOS logic gate 1B. In a case of low fixing as illustrated in FIG. 3, by sharing the common PMOS 21p between the CMOS logic gate 1A and the CMOS logic gate 1B, the number of mode-switching MOSs is reduced, and increase in chip area is more effectively restricted.

The NMOS 21n1 is connected between the output line Vo1 of the CMOS logic gate 1A and the ground line Vss.

The NMOS 21n2 is connected between the output line Vo2 of the CMOS logic gate 1B and the ground line Vss.

When a control signal of low (L) is inputted to respective gates of the mode-switching MOSS, that is, the PMOS 21p, the NMOS 21n1, and the NMOS 21n2 in the configuration illustrated in FIG. 3, the PMOS 21p is turned on, and the NMOS 21n1 and the NMOS 21n2 are turned off. Accordingly, the CMOS logic gate 1A and the CMOS logic gate 1B perform a normal operation as the operation at a time of no mode-switching MOS being provided (normal operation mode).

When a control signal of high (H) is inputted to the respective gates of the PMOS 21p, the NMOS 21n1, and the NMOS 21n2, the PMOS 21p is turned off, and the NMOS 21n1 and the NMOS 21n2 are turned on. Thereby, the output line Vo1 of the CMOS logic gate 1A is electrically connected to the ground line Vss by the NMOS 21n1 to be fixed to low (L). The output line Vo2 of the CMOS logic gate 1B is electrically connected to the ground line Vss by the NMOS 21n2 to be fixed to low (L). Accordingly, a signal of low (L) is inputted to a CMOS logic gate that is not illustrated and located at a subsequent stage of the CMOS logic gate 1B.

Since the output line Vo1 is connected to the gate of the PMOS 12p and the gate of the NMOS 12n of the CMOS logic gate 1B, gate inputs of the PMOS 12p and the NMOS 12n become low (L). Likewise, an output line of a CMOS logic gate that is not illustrated and located at a preceding stage of the CMOS logic gate 1A is also fixed to low (L), and gate inputs of the PMOS 11p and the NMOS 11n of the CMOS logic gate 1A are also low (L).

Since in this case, gate terminals, source terminals, drain terminals, and back gate terminals of the NMOS 11n and the NMOS 12n all become low (L), none of parasitic capacitances Cgs, Cgd, Csb, Cdb, and Cgb of the NMOS 11n and the NMOS 12n is activated.

In the PMOS 11p and the PMOS 12p, gate terminals, source terminals, and drain terminals become low (L), and since the back gate terminal is connected to the power supply line Vdd, the back gate terminal becomes high (H). Thereby, parasitic capacitances Cgb between the gate terminals and the back gate terminals, parasitic capacitances Csb between the source terminals and the back gate terminals, and parasitic capacitances Cdb between the drain terminals and the back gate terminals are activated, and the other parasitic capacitances Cgs and Cgd than the parasitic capacitances Cgb, Csb, and Cdb are not activated.

In the NMOS 21n1 and the NMOS 21n2, high (H) is inputted to the gate terminals, and source terminals, drain terminals, and back gate terminals are low (L). Thereby, parasitic capacitances Cgs between the gate terminals and the source terminals, parasitic capacitance Cgd between the gate terminals and the drain terminals, and parasitic capacitances Cgb between the gate terminals and the back gate terminals are activated, and the other parasitic capacitances Csb and Cdb than the parasitic capacitances Cgs, Cgd, and Cgb are not activated.

In the PMOS 21p, a drain terminal is low (L), a gate terminal, a source terminal and a back gate terminal are high (H). Thereby, a parasitic capacitance Cgd between the gate terminal and the drain terminal, and a parasitic capacitance Cdb between the drain terminal and the back gate terminal are activated, and the other parasitic capacitances Cgs, Csb, and Cgb than the parasitic capacitances Cgd and Cdb are not activated.

However, contribution of the activated parasitic capacitances of the mode-switching MOS to the combined capacitance is small as described above. Since the parasitic capacitances of the NMOS 11n and the NMOS 12n are not activated, a combined capacitance SCn of the parasitic capacitances does not contribute to a capacitance between the power supply line Vdd and the ground line Vss. Consequently, in the case of low fixing illustrated in FIG. 3, a combined capacitance SCp of the parasitic capacitances activated in the PMOS 11p and the PMOS 12p becomes dominant as the capacitance between the power supply line Vdd and the ground line Vss. The combined capacitance SCp that becomes dominant in this way restricts a voltage fluctuation in the power supply line Vdd to stabilize the power supply voltage.

In the configuration of an ordinary CMOS, a PMOS has a larger area formed on a chip than an NMOS. Consequently, it is more effective to perform activation of the parasitic capacitance to a PMOS than to an NMOS, and it is expected to obtain a higher effect in the configuration in FIG. 3 than in the configuration in FIG. 2. However, it depends on a manufacturing process and the like whether the configuration of high fixing illustrated in FIG. 2 or the configuration of low fixing illustrated in FIG. 3 is used, and therefore a suitable one can be selected as necessary.

(Specific Circuit Example of High Fixing)

Figure 4:
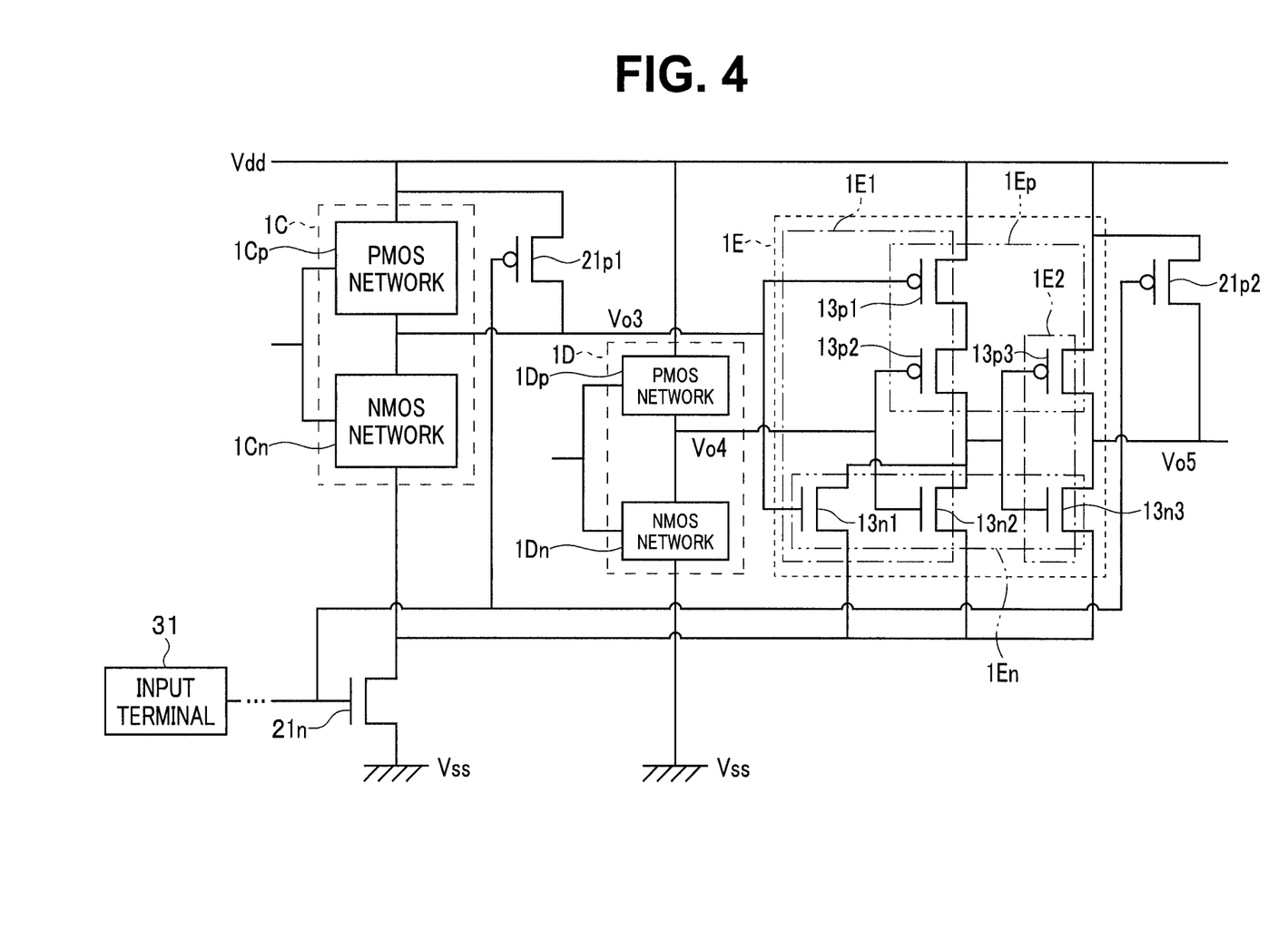
FIG. 4 is a circuit diagram illustrating a configuration example where an output signal level of a CMOS logic gate having a large size is fixed to high in the semiconductor device according to the first embodiment.

FIG. 4 is a circuit diagram illustrating a configuration example where an output signal level of a CMOS logic gate of a large size is fixed to high (H) in a semiconductor device.

The semiconductor device illustrated in FIG. 4 includes a CMOS logic gate 1C, a CMOS logic gate 1D, and a CMOS logic gate 1E.

The CMOS logic gate 1C includes a PMOS network 1Cp connected to a power supply line Vdd, and an NMOS network 1Cn connected to a ground line Vss side of the PMOS network 1Cp.

The CMOS logic gate 1D has a PMOS network 1Dp connected to the power supply line Vdd, and an NMOS network 1Dn connected between the PMOS network 1Dp and the ground line Vss. Note that the CMOS logic gate 1D has a small size (specifically, an area on a chip) as schematically illustrated in FIG. 4, and has a small parasitic capacitance capable of being activated as compared with the CMOS logic gate 1C.

The CMOS logic gate 1E has a PMOS network 1Ep connected to the power supply line Vdd, and an NMOS network 1En connected to a ground line Vss side of the PMOS network 1Ep. The PMOS network 1Ep includes three PMOSs 13$p$1, 13$p$2, and 13$p$3, and the NMOS network 1En includes three NMOSs 13$n$1, 13$n$2, and 13$n$3.

The CMOS logic gate 1E illustrated in FIG. 4 is configured as an OR circuit that is a combination of an NOR circuit 1E1 at a preceding stage side, and a NOT circuit 1E2 at a subsequent stage side. An output signal of the CMOS logic gate 1C, and an output signal of the CMOS logic gate 1D are inputted to the NOR circuit 1E1. An output signal of the NOR circuit 1E1 is inputted to the NOT circuit 1E2.

The NOR circuit 1E1 includes the PMOS 13$p$1 and the NMOS 13$n$1 that are connected to an output line Vo3 of the CMOS logic gate 1C, and the PMOS 13$p$2 and the NMOS 13$n$2 that are connected to an output line Vo4 of the CMOS logic gate 1D. The PMOS 13$p$1, the PMOS 13$p$2, and the NMOS 13$n$2 are connected in order from the power supply line Vdd to the ground line Vss side. A drain of the NMOS 13$n$1 is connected to an output line of the NOR circuit 1E1.

The NOT circuit 1E2 includes the PMOS 13$p$3 and the NMOS 13$n$3 to which the output line of the NOR circuit 1E1 is connected.

The semiconductor device further includes a PMOS 21$p$1, a PMOS 21$p$2, and an NMOS 21$n$, as mode-switching MOSs.

The PMOS 21$p$1 is connected between the power supply line Vdd and the output line Vo3 of the CMOS logic gate 1C.

The PMOS 21$p$2 is connected between the power supply line Vdd and an output line Vo5 of the CMOS logic gate 1E.

The NMOS 21$n$ is connected between a source of the NMOS network 1Cn of the CMOS logic gate 1C and a source of the NMOS network 1En of the CMOS logic gate 1E, and the ground line Vss. By sharing the NMOS 21$n$ between the CMOS logic gate 1C and the CMOS logic gate 1E, the number of mode-switching MOSs is reduced, and increase in the chip area is effectively restricted.

A PMOS as a mode-switching MOS is not provided between the output line Vo4 of the CMOS logic gate 1D in which a parasitic capacitance capable of being activated is smaller than a predetermined value, and the power supply line Vdd, and the CMOS logic gate 1D is not connected to the NMOS 21$n$. By providing the mode-switching MOSs in only the CMOS logic gates having parasitic capacitances of a predetermined value or more in this way, it is possible to reduce the number of mode-switching MOSs while effectively using many of the parasitic capacitances capable of being activated, and increase in the chip area is more effectively restricted.

Respective gate terminals of the PMOS 21$p$1, the PMOS 21$p$2, and the NMOS 21$n$ are connected to an input terminal 31 of the semiconductor device. One example of the input terminal 31 is an input terminal for test (a so-called test pin) for operating the semiconductor device in a test mode. By the configuration like this, the PMOS 21$p$1, the PMOS 21$p$2, and the NMOS 21$n$ that are included in the mode-switching MOSs are controlled in common by a control signal inputted from the single input terminal 31, and therefore it is possible to reduce the number of input terminals.

When the CMOS logic gates 1C, 1D, and 1E are included in a test circuit for testing the semiconductor device, for example, a normal operation as the test circuit is performed by inputting a control signal of high (H) to the input terminal 31. By inputting a control signal of low (L) to the input terminal 31, the CMOS logic gates 1C, 1D, and 1E perform a decap operation to perform a similar function to the function of the decoupling capacitor DC, and stabilizes the power supply voltage when the semiconductor device operates by a normal circuit other than the test circuit.

When the CMOS logic gates 1C, 1D and 1E are included in the normal circuit of the semiconductor device, for example, a normal operation as the normal circuit is performed by inputting a control signal of high (H) to the input terminal 31. By inputting a control signal of low (L) to the input terminal 31, the CMOS logic gates 1C, 1D, and 1E perform a decap operation to perform a similar function to the function of the decoupling capacitor DC, and stabilizes the power supply voltage when the semiconductor device operates by the test circuit. When the input terminal 31 is an input terminal for test, the input signal level from the input terminal 31 can be inverted and supplied to the mode-switching MOSs, or the configuration of low fixing as shown by referring to FIG. 3 can be applied to the CMOS logic gates 1C, 1D, and 1E.

In this way, it is possible to use a parasitic capacitance of an appropriate circuit that is a circuit that is not used, such as the test circuit at the time of the normal circuit being operated, and the normal circuit at the time of the test circuit being operated, as the capacitance that performs the similar function to the function of the decoupling capacitor DC. As another example of the circuit that is not used, a functional block (a functional block in a rest state or the like) that is not used in a customer application, in various functional blocks provided in the semiconductor device can be cited.

According to the first embodiment, it is possible to stabilize the voltage of the power supply line Vdd, and restrict increase in the chip area of the semiconductor device, without additionally providing a decoupling capacitor DC, by providing the mode-switching MOSs for fixing the output signal level of the CMOS logic gate 1 to high (H) or low (L), and activating the parasitic capacitance of the CMOS logic gate 1.

Further, by adding MOSs correspondingly to the CMOS logic gate capable of activating the parasitic capacitance of a predetermined value or more, it is possible to reduce the number of MOSs that are added more than in the case of adding MOSs to all the CMOS logic gates. Thereby, it is possible to activate an effective capacitance while further restricting increase in the chip area.

Second Embodiment

Figure 5:
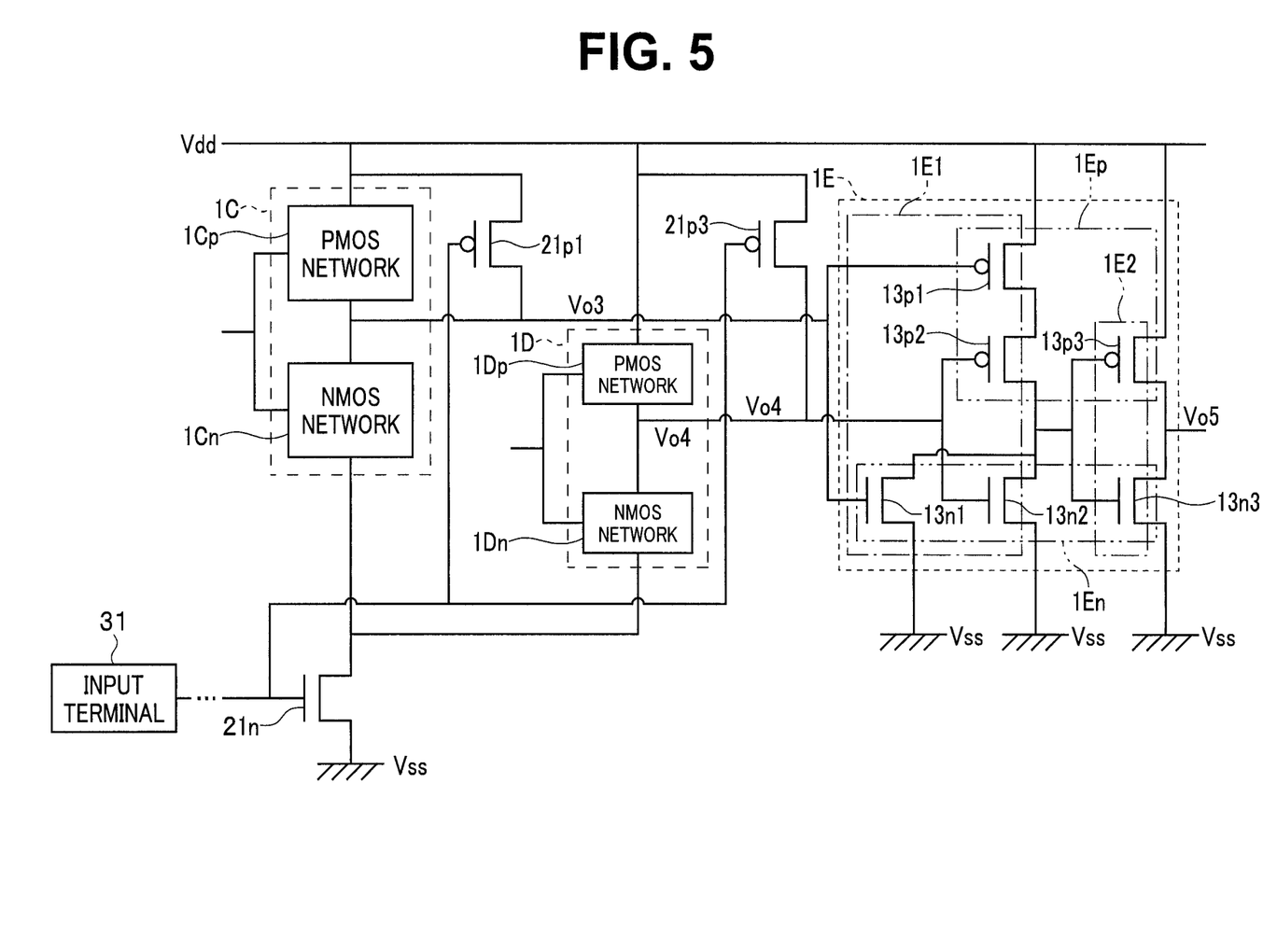
FIG. 5 is a circuit diagram illustrating a configuration example where an output signal level is fixed to high, for a CMOS logic gate in which the output signal level is not fixed to high even when an input signal level is fixed to high, in a semiconductor device according to a second embodiment.

FIG. 5 is a circuit diagram illustrating a configuration example where an output signal level is fixed to high (H), to a CMOS logic gate in which the output signal level is not fixed to high (H) even when an input signal level is fixed to high (H) in a semiconductor device according to the present embodiment.

In the second embodiment, similar parts to the parts of the first embodiment will be assigned with the same reference signs to omit explanation of these parts properly, and a difference will mainly be described.

In the present embodiment, whether or not to provide a mode-switching MOS is determined based on what signal a CMOS logic gate outputs with respect to an input signal, instead of being determined based on a size of the CMOS logic gate.

In the semiconductor device illustrated in FIG. 5, as compared with the semiconductor device illustrated in FIG. 4, a PMOS 21p3 corresponding to a CMOS logic gate 1D is added, and a PMOS 21p2 corresponding to a CMOS logic gate 1E is omitted. In the present embodiment, sizes of CMOS logic gates are not distinguished, and the mode-switching MOS is provided for the CMOS logic gate of a small size (here, the CMOS logic gate 1D).

The PMOS 21p3 is connected between a power supply line Vdd and an output line Vo4 of the CMOS logic gate 1D.

An NMOS 21n is connected between a source of an NMOS network 1Cn of the CMOS logic gate 1C and a source of an NMOS network 1Dn of the CMOS logic gate 1D, and a ground line Vss. By sharing the NMOS 21n between the CMOS logic gate 1C and the CMOS logic gate 1D, the number of mode-switching MOSs is reduced, and increase in the chip area is restricted more effectively, as described above.

A source of the NMOS network 1En of the CMOS logic gate 1E is connected to the ground line Vss.

Here, the PMOS 21p2 is omitted for the following reason. When a control signal of low (L) is inputted from an input terminal 31, outputs of the CMOS logic gate 1C and the CMOS logic gate 1D are both fixed to high (H), and an output of the CMOS logic gate 1E configured as an OR circuit is automatically fixed to high (H). Accordingly, it is not necessary to provide the PMOS 21p2 for fixing the output signal level of the CMOS logic gate 1C to high (H).

Mode-switching MOSs do not have to be provided for CMOS logic gates where output signal levels are high (H) when a plurality of input signal levels are all high (H) in an AND circuit, an XNOR circuit and the like, regardless of an OR circuit. Accordingly, a mode-switching MOS can be provided for only a CMOS logic gate where an output signal level is not always fixed to high (H) even when an input signal level is fixed to high (H).

As described above, the configuration of low fixing as illustrated in FIG. 3 may be applied to the configuration in FIG. 5. In this case, a mode-switching MOS may be provided for only a CMOS logic gate where an output signal level is not always fixed to low (L) even when an input signal level is fixed to low (L).

According to the second embodiment, a substantially similar effect to the effect of the first embodiment is exhibited, and it is possible to activate a parasitic capacitance to stabilize a power supply voltage while reducing the number of MOSs that are added to restrict increase in the chip area, by providing the mode-switching MOS for only the CMOS logic gate where the output signal level is not fixed to high (H) or low (L) even when the input signal level is fixed to high (H) or low (L).

Third Embodiment

Figure 6:
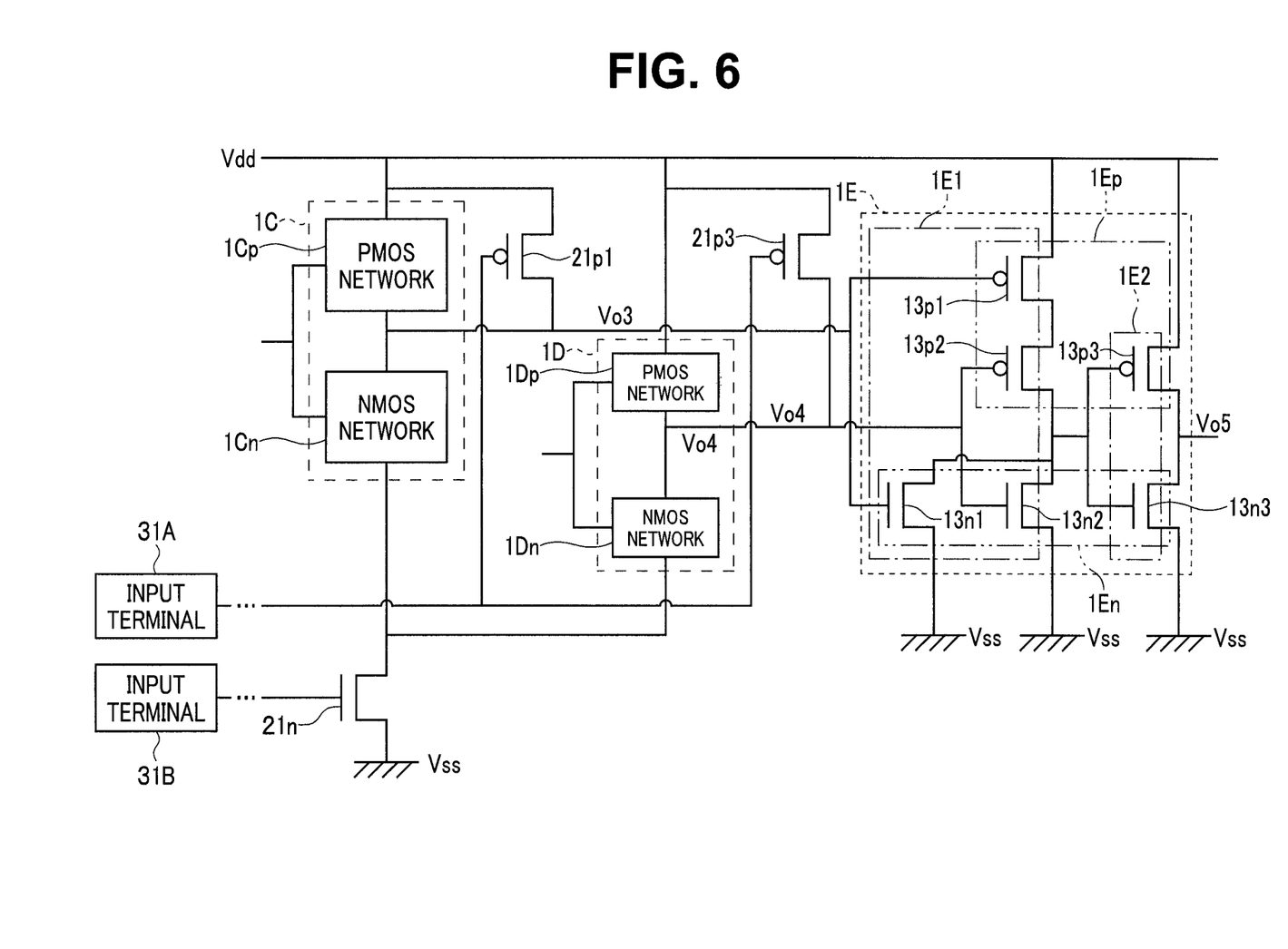
FIG. 6 is a circuit diagram illustrating a configuration example where an output signal level is fixed to high when a plurality of input terminals for a control signal are provided so as to be usable as a power off mode, in a semiconductor device according to a third embodiment.

FIG. 6 is a circuit diagram illustrating a configuration example where an output signal level is fixed to high (H) in a case where a plurality of input terminals for a control signal are provided so as to be usable as a power off mode, in a semiconductor device according to the present embodiment.

In the third embodiment, similar parts to the parts of the first and the second embodiments will be assigned with the same reference signs to omit explanation of the parts properly, and a difference will mainly be described.

The semiconductor device of the present embodiment illustrated in FIG. 6 is configured to be substantially the same as the semiconductor device illustrated in FIG. 5, but differs in that an input terminal of a mode-switching MOS is divided into two systems, NMOS and PMOS.

In other words, gates of a PMOS 21p1 and a PMOS 21p3 are connected to an input terminal 31A, and a gate of an NMOS 21n is connected to an input terminal 31B. One example of the input terminal 31B is an input terminal for test, and one example of the input terminal 31A is an input terminal for power off.

An operation of the semiconductor device at a time of receiving control signals of high (H) from the input terminal 31A and the input terminal 31B is the same as an operation of the semiconductor device at the time of a control signal of high (H) being inputted to the input terminal 31 in FIG. 5.

An operation of the semiconductor device at a time of receiving control signals of low (L) from the input terminal 31A and the input terminal 31B is same as the operation of the semiconductor device at the time of a control signal of low (L) being inputted to the input terminal 31 in FIG. 5.

When a control signal of high (H) is inputted from the input terminal 31A and a control signal of low (L) is inputted from the input terminal 31B, all of the PMOS 21p1, the PMOS 21p3, and the NMOS 21n that are mode-switching MOSs are turned off (power off operation mode), and it is possible to reduce a leak current that flows from a power supply line Vdd to a ground line Vss side via the PMOS 21p1, the PMOS 21p3, and the NMOS 21n.

Note that needless to say, the configuration of the present embodiment in which the input terminal of the mode-switching MOSs is divided into the two systems, NMOS and PMOS may be applied to the configuration of low fixing as illustrated in FIG. 3.

According to the third embodiment, a substantially similar effect to the effect of the second embodiment is exhibited, and NMOSs and PMOSs of the mode-switching MOSs are independently controlled, so that it is possible to perform a power off operation, and reduce a leak current.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A semiconductor device, comprising:
a power supply line and a ground line;
at least one CMOS logic gate including a P-type MOSFET network connected to the power supply line, and an N-type MOSFET network connected to a ground line side of the P-type MOSFET network; and
a MOSFET configured to give a potential difference to a parasitic capacitance of the CMOS logic gate by fixing an output signal level of the CMOS logic gate,
wherein the MOSFET
includes
at least one P-type MOSFET connected between the power supply line and an output line of the CMOS logic gate, and
an N-type MOSFET connected between the CMOS logic gate and the ground line, and
fixes an output signal level of the CMOS logic gate to high, and activates a parasitic capacitance of the N-type MOSFET network, by inputting a control signal of low to a gate terminal of the P-type MOSFET, and inputting a control signal of low to a gate terminal of the N-type MOSFET.

2. The semiconductor device according to claim 1,
wherein the at least one CMOS logic gate includes a plurality of CMOS logic gates,
the at least one P-type MOSFET includes a plurality of P-type MOSFETs between the power supply line and a plurality of output lines of the plurality of CMOS logic gates,
the N-type MOSFET is connected between the plurality of CMOS logic gates and the ground line in common, and
output signal levels of the plurality of CMOS logic gates are fixed to high, and parasitic capacitances of a plurality of N-type MOSFET networks of the plurality of CMOS logic gates are activated, by inputting a control signal of low to a plurality of gate terminals of the plurality of P-type MOSFETs, and inputting a control signal of low to the gate terminal of the N-type MOSFET.

3. The semiconductor device according to claim 2, further comprising:
an input terminal to which a control signal is inputted from outside,
wherein the plurality of gate terminals of the plurality of P-type MOSFETs, and the gate terminal of the N-type MOSFET are connected to the input terminal.

4. The semiconductor device according to claim 2, further comprising:
a first input terminal to which a first control signal is inputted from outside; and
a second input terminal to which a second control signal is inputted from outside,
wherein the plurality of gate terminals of the plurality of P-type MOSFETs are connected to the first input terminal, and
the gate terminal of the N-type MOSFET is connected to the second input terminal.

5. A semiconductor device, comprising:
a power supply line and a ground line;
at least one CMOS logic gate including a P-type MOSFET network connected to the power supply line, and an N-type MOSFET network connected to a ground line side of the P-type MOSFET network; and
a MOSFET configured to give a potential difference to a parasitic capacitance of the CMOS logic gate by fixing an output signal level of the CMOS logic gate,
wherein the MOSFET
includes
a P-type MOSFET connected between the power supply line and the at least one CMOS logic gate, and
at least one N-type MOSFET connected between an output line of the CMOS logic gate and the ground line, and
fixes the output signal level of the CMOS logic gate to low, and activates a parasitic capacitance of the P-type MOSFET network, by inputting a control signal of high to a gate terminal of the P-type MOSFET, and inputting a control signal of high to a gate terminal of the N-type MOSFET.

6. The semiconductor device according to claim 5,
wherein the at least one CMOS logic gates includes a plurality of CMOS logic gates,
the at least one N-type MOSFET includes a plurality of N-type MOSFETs between a plurality of output lines of the plurality of CMOS logic gates, and the ground line,
the P-type MOSFET is connected between the power supply line and the plurality of CMOS logic gates in common, and
output signal levels of the plurality of CMOS logic gates are fixed to low, and parasitic capacitances of a plurality of P-type MOSFET networks of the plurality of CMOS logic gates are activated, by inputting a control signal of high to the gate terminal of the P-type MOSFET, and inputting a control signal of high to a plurality of gate terminals of the plurality of N-type MOSFETs.

7. The semiconductor device according to claim 6, further comprising
an input terminal to which a control signal is inputted from outside,
wherein the gate terminal of the P-type MOSFET, and the plurality of gate terminals of the plurality of N-type MOSFETs are connected to the input terminal.

8. The semiconductor device according to claim 6, further comprising:
a first input terminal to which a first control signal is inputted from outside; and
a second input terminal to which a second control signal is inputted from outside,
wherein the gate terminal of the P-type MOSFET is connected to the first input terminal, and
the plurality of gate terminals of the plurality of N-type MOSFETS are connected to the second input terminal.

9. The semiconductor device according to claim 1,
wherein the MOSFET is provided correspondingly to the CMOS logic gate where a parasitic capacitance activated by fixing the output signal level of the CMOS logic gate has a predetermined value or more.

10. The semiconductor device according to claim 1,
wherein the MOSFET is provided correspondingly to the CMOS logic gate where the output signal level is not fixed even when an input signal level is fixed.

11. The semiconductor device according to claim 5,
wherein the MOSFET is provided correspondingly to the CMOS logic gate where a parasitic capacitance activated by fixing the output signal level of the CMOS logic gate has a predetermined value or more.

12. The semiconductor device according to claim 5, wherein the MOSFET is provided correspondingly to the CMOS logic gate where the output signal level is not fixed even when an input signal level is fixed.

* * * * *